United States Patent
Chang

(10) Patent No.: US 11,183,253 B2
(45) Date of Patent: Nov. 23, 2021

(54) MASTER-SLAVE SYSTEM AND DATA TRANSMISSION METHOD THEREOF

(71) Applicant: Nuvoton Technology Corporation, Hsinchu (TW)

(72) Inventor: Sheng-Tsai Chang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 16/907,318

(22) Filed: Jun. 22, 2020

(65) Prior Publication Data

US 2021/0134374 A1    May 6, 2021

(30) Foreign Application Priority Data

Nov. 4, 2019  (TW) .................................. 108139892

(51) Int. Cl.
*G11C 16/10* (2006.01)
*G11C 16/30* (2006.01)

(52) U.S. Cl.
CPC .............. *G11C 16/30* (2013.01); *G11C 16/10* (2013.01)

(58) Field of Classification Search
CPC ...................................................... G11C 16/10
USPC ........................................ 365/185.17; 326/63
See application file for complete search history.

(56) References Cited

U.S. PATENT DOCUMENTS 10,476,504 B1 *  11/2019  Chen ............. H03K 19/017509
2007/0073449 A1   3/2007   Kraemer et al.

FOREIGN PATENT DOCUMENTS

| WO | 2004010664 | 1/2004 |
| WO | 2009101404 | 8/2009 |

OTHER PUBLICATIONS

"Office Action of Taiwan Counterpart Application", dated Jul. 30, 2020, p. 1-p. 11.

* cited by examiner

*Primary Examiner* — Jason Lappas
(74) *Attorney, Agent, or Firm* — JCIPRNET

(57) ABSTRACT

A master-slave system and a data transmission method thereof are provided. The master-slave system includes a slave device and a master device. The master device is coupled to the slave device via a power line. The master device outputs a voltage signal to the slave device via the power line. In a first period, the master device outputs the voltage signal subject to a first voltage level change to the slave device based on first data via the power line, so that the slave device obtains the first data based on the first voltage level change. In a second period, the slave device changes load of the power line based on second data, so that the voltage signal on the power line is subject to a second voltage level change. The master device obtains the second data based on the second voltage level change.

20 Claims, 3 Drawing Sheets

MASTER-SLAVE SYSTEM AND DATA TRANSMISSION METHOD THEREOF

CROSS-REFERENCE TO RELATED APPLICATION

This application claims the priority benefit of Taiwan application serial no. 108139892, filed on Nov. 4, 2019. The entirety of the above-mentioned patent application is hereby incorporated by reference herein and made a part of this specification.

BACKGROUND OF THE INVENTION

1. Field of the Invention

The invention relates to a system, and in particular, to a master-slave system and a data transmission method thereof.

2. Description of Related Art

In a general architecture of a master-slave system, a plurality of signal lines, for example, a power line or a signal transmission line, need to be coupled between a master device and a slave device, so that the master device transmits power or data to the slave device. In addition, in an existing technology, to lower wiring complexity, the master device transmits data to the slave device via only the power line. However, the master-slave system in which data is transmitted via only the power line can allow the master device only to transmit the data to the slave device. Consequently, the master device cannot learn an operating status of the slave device after the slave device receives the data. For example, the master device cannot learn whether the slave device completely receives the data, or whether the slave device operates in a state in which the slave device can receive data. In other words, an architecture of the master-slave system in which data is transmitted via only the power line can implement only a function of unidirectional transmission, and a data loss may occur. In view of this, the following provides solutions in several embodiments.

SUMMARY OF THE INVENTION

The invention provides a master-slave system and a data transmission method thereof to implement a function of bidirectional communication between a master device and a slave device.

The master-slave system of the invention includes a slave device and a master device. The master device is coupled to the slave device via a power line. The master device is configured to output a voltage signal to the slave device via the power line. In a first period, the master device outputs the voltage signal subject to a first voltage level change to the slave device based on first data via the power line, so that the slave device obtains the first data based on the first voltage level change. In a second period, the slave device changes load of the power line based on second data, so that the voltage signal on the power line is subject to a second voltage level change, and the master device obtains the second data based on the second voltage level change.

The data transmission method of the master-slave system of the invention is applied to a master device and a slave device. The master device is coupled to the slave device via a power line, and outputs a voltage signal to the slave device via the power line. The data transmission method includes the following steps. In a first period, the voltage signal subject to a first voltage level change is outputted to the slave device based on first data via the power line by the master device. In the first period, the first data is obtained based on the first voltage level change by the slave device. In a second period, load of the power line is changed based on second data by the slave device, so that the voltage signal on the power line is subject to a second voltage level change. In the second period, the second data is obtained by the master device based on the second voltage level change.

Based on the above, according to the master-slave system and the data transmission method thereof in the invention, a function of bidirectional communication can be implemented via a power line coupled between a slave device and a master device.

DESCRIPTION OF THE EMBODIMENTS

Figure 1:
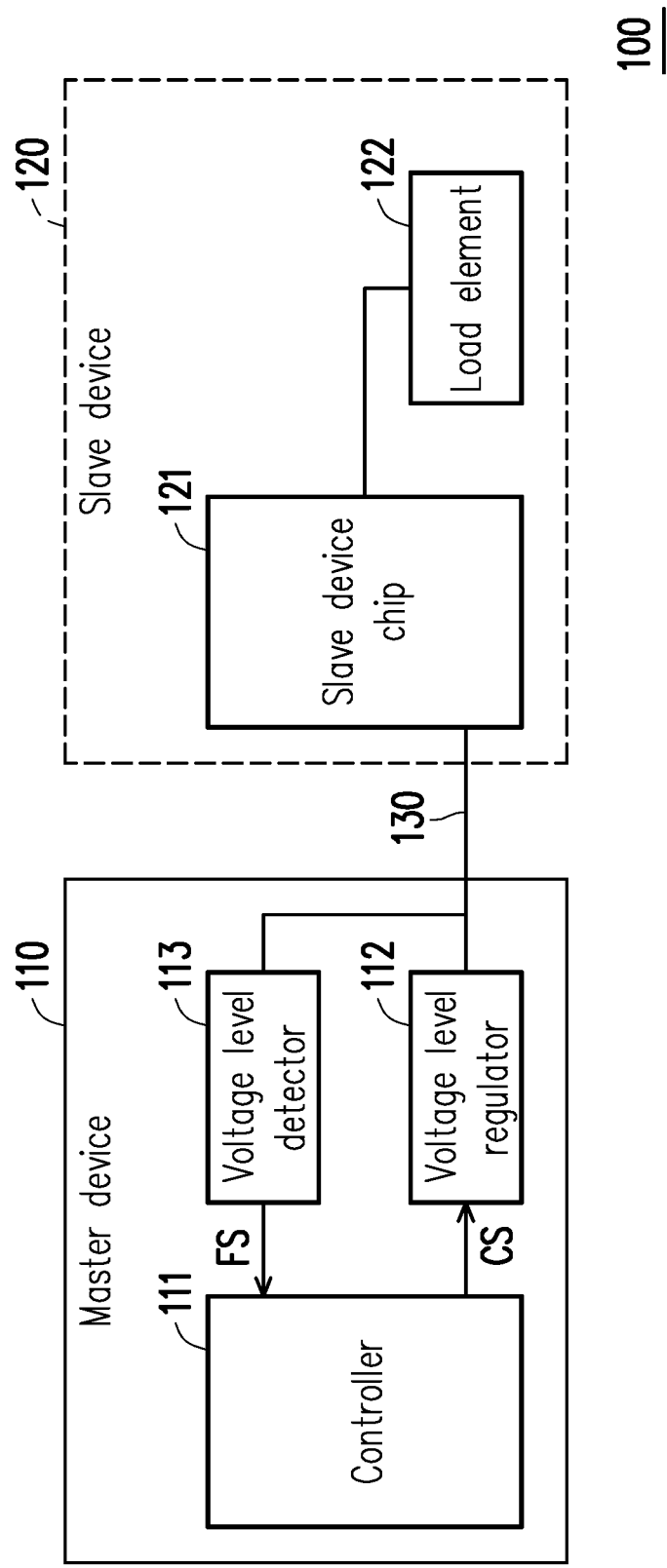
FIG. 1 is a schematic block diagram of a master-slave system according to an embodiment of the invention.

Reference will now be made in detail to the preferred embodiments of the invention, examples of which are illustrated in the accompanying drawings. Wherever possible, the same reference numbers are used in the drawings and the description to refer to the same or like parts.

FIG. 1 is a schematic block diagram of a master-slave system according to an embodiment of the invention. Referring to FIG. 1, a master-slave system 100 includes a master device 110 and a slave device 120. The master device 110 is coupled to the slave device 120 via a power line 130 and provides power to the slave device 120 via the power line 130. In this embodiment, the master device 110 includes a controller 111, a voltage level regulator 112, and a voltage level detector 113. The controller 111 is coupled to the voltage level regulator 112 and the voltage level detector 113, and the voltage level regulator 112 and the voltage level detector 113 are coupled to the slave device 120 via the power line 130. In this embodiment, the slave device 120 includes a slave device chip 121 and a load element 122. The slave device chip 121 is coupled to the load element 122, and coupled to the voltage level regulator 112 and the voltage level detector 113 of the master device 110 via the power line 130.

In this embodiment, the voltage level regulator 112 can change a voltage level of a voltage signal transmitted on the power line 130. The voltage level detector 113 can detect a voltage level change of the voltage signal transmitted on the power line 130, to provide corresponding data to the controller 111. In the present embodiment, the slave device chip 121 may drive the slave device 120 via the voltage signal on the power line 130, and may obtain corresponding data based on a voltage level change of the voltage signal transmitted on the power line 130. It should be noted that, since the load element 122 is connected to the power line 130, the load element 122 can change the load of the power line 130, to correspondingly change the voltage level of the voltage signal transmitted on the power line 130, to produce another voltage level change.

Specifically, the master device 110 and the slave device 120 may communicate with each other via the power line 130. When the master device 110 intends to transmit first data CS to the slave device 120, the master device 110 may output a voltage signal subject to a first voltage level change corresponding to the first data CS to the slave device 120 via the power line 130, so that the slave device 120 may correspondingly obtain data content of the first data CS based on the first voltage level change. When the slave device 120 intends to return second data FS to the master device 110, the slave device 120 may impose a second voltage level change corresponding to the second data FS to the voltage signal transmitted on the power line 130, so that the master device 110 may obtain data content of the second data FS based on the second voltage level change.

Therefore, in the master-slave system 100 in the present embodiment, a function of bidirectional data transmission can be implemented via a single power line 130. A manner of data transmission between the master device 110 and the slave device 120 is further described below in detail with reference to FIG. 2.

Figure 2:
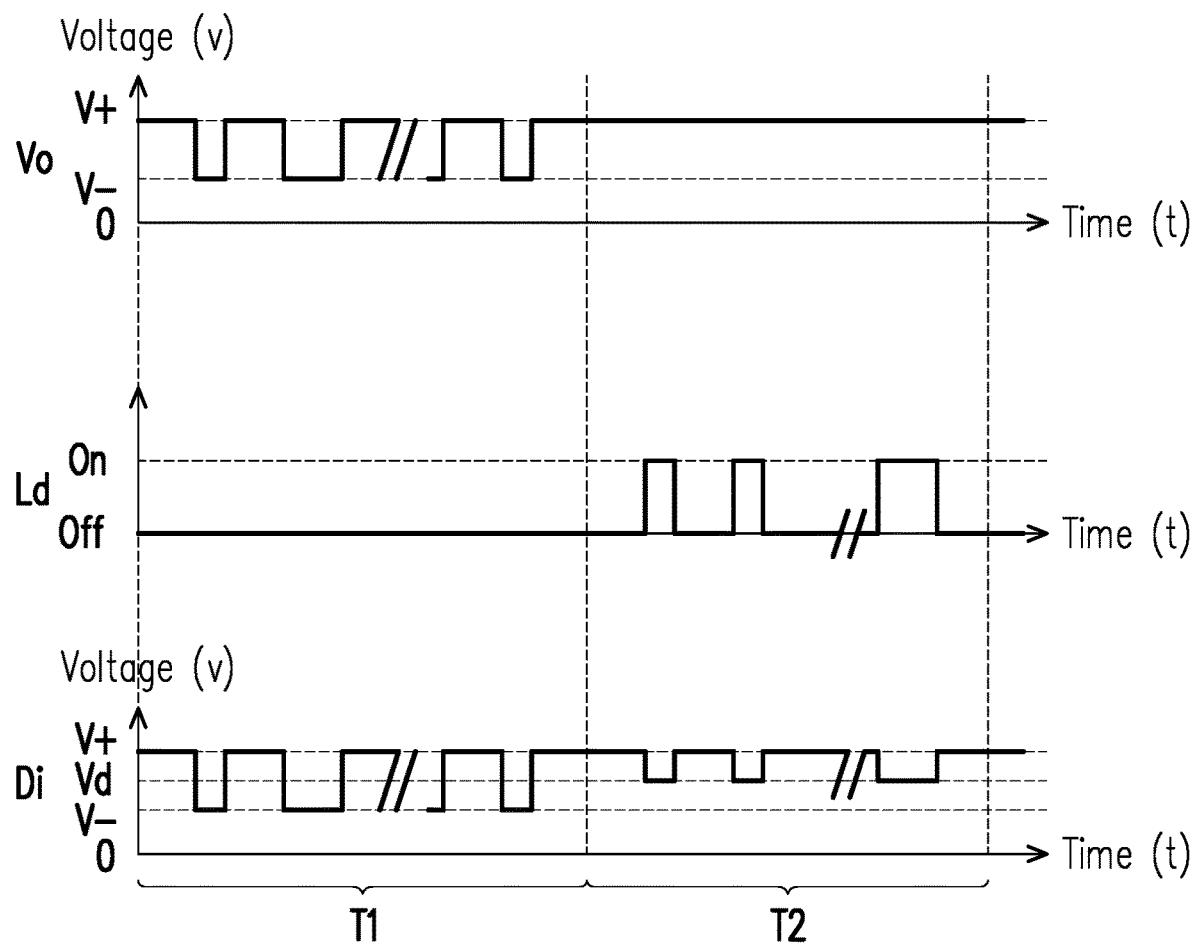
FIG. 2 is a schematic diagram of a voltage level change of a voltage signal according to an embodiment of the invention.

FIG. 2 is a schematic diagram of a voltage level change of a voltage signal according to an embodiment of the invention. Referring to FIG. 1 and FIG. 2, in a first period T1, the master device 110 changes, via the voltage level regulator 112 based on the first data CS provided by the controller 111, the voltage level of the voltage signal transmitted on the power line 130. For example, the voltage level regulator 112 may output a voltage signal Vo shown in FIG. 2 subject to the first voltage level change to the power line 130. Then in the first period T1, the slave device chip 121 and the voltage level detector 113 may receive a voltage signal Di shown in FIG. 2 also subject to the first voltage level change. The first voltage level change means that the voltage signal Di shown in FIG. 2 is subject to changes in a high voltage level V+ and a low voltage level V−. Therefore, in the first period T1, the slave device chip 121 may obtain data content the same as the first data CS by analyzing the first voltage level change of the voltage signal transmitted on the power line 130.

In a second period T2, the voltage level regulator 112 stops regulating the voltage level of the voltage signal transmitted on the power line 130, and the slave device 120 may control, based on the second data to be provided to the master device 110, the load element 122 whether to put load Ld on/off the power line 130, to change the voltage level of the voltage signal transmitted on the power line 130. Accordingly, in the second period T2, for example, the voltage level detector 113 may receive the voltage signal Di shown in FIG. 2 subject to the second voltage level change. The second voltage level change means that the voltage signal Di shown in FIG. 2 is subject to changes in the high voltage level V+ and a reference voltage level Vd. Therefore, in the second period T2, the slave device chip 121 may obtain data content of the second data FS by analyzing the second voltage level change of the voltage signal transmitted on the power line 130. In addition, it should be noted that, neither the first voltage level change nor the second voltage level change in the invention goes beyond an operating voltage range of the slave device 120. Moreover, the voltage levels V+, V−, and Vd in the present embodiment are not limited to level relationships shown in FIG. 2.

In the present embodiment, the first data and the second data may be digital data, and the first data and the second data may each include a first element value and a second element value. For example, the first element value may be 0, and the second element value may be 1. In other words, the voltage signal on the power line 130 may include a first element value and a second element value corresponding to each of the first voltage level change and the second voltage level change as two voltage level change patterns. Herein, the two voltage level change patterns of the first voltage level change may be, for example, an allocation proportion or an arrangement manner in a unit of time of the voltage level V+ and the voltage level V− that are different. The two voltage level change patterns of the second voltage level change may be, for example, an allocation proportion or an arrangement manner in a unit of time of the voltage level V+ and the voltage level Vd that are different, or different voltage pulse quantities or different voltage pulse lengths in a unit of time. No limitation is set thereto in the invention. A specific communication protocol may be formulated between the master device 110 and the slave device 120, so that the two parties can effectively obtain corresponding data information based on a result of analyzing the voltage level change of the voltage signal transmitted on the power line 130.

In an embodiment, the master device 110 may be a writer, for example, a flash memory writer, and the slave device 120 may be a storage apparatus chip, for example, a flash memory, but the invention is not limited thereto. Therefore, in the present embodiment, when the master device 110 (flash memory writer) intends to write the first data to the slave device 120 (flash memory), in the first period T1 (data writing period), the master device 110 may change the voltage level of the voltage signal transmitted on the power line 130, so that the voltage signal is subject to the first voltage level change. In addition, the slave device chip 121 of the slave device 120 may analyze the first voltage level change of the received voltage signal to effectively obtain the data content of the first data. The first data is written data written to the slave device 120. Then, after the first data provided by the master device 110 is transmitted, in the second period T1 (response period), the slave device 120 controls the load element 130 to change the voltage level of the voltage signal transmitted on the power line 130, so that the voltage signal is subject to the second voltage level change. In addition, the voltage level detector 113 of the master device 110 may analyze the second voltage level change of the voltage signal transmitted on the power line 130 to effectively obtain the data content of the second data. The second data is feedback data in response to whether the slave device 120 completely receives the written data. Therefore, the master device 110 and the slave device 120 can effectively perform a function of bidirectional communication.

Figure 3:
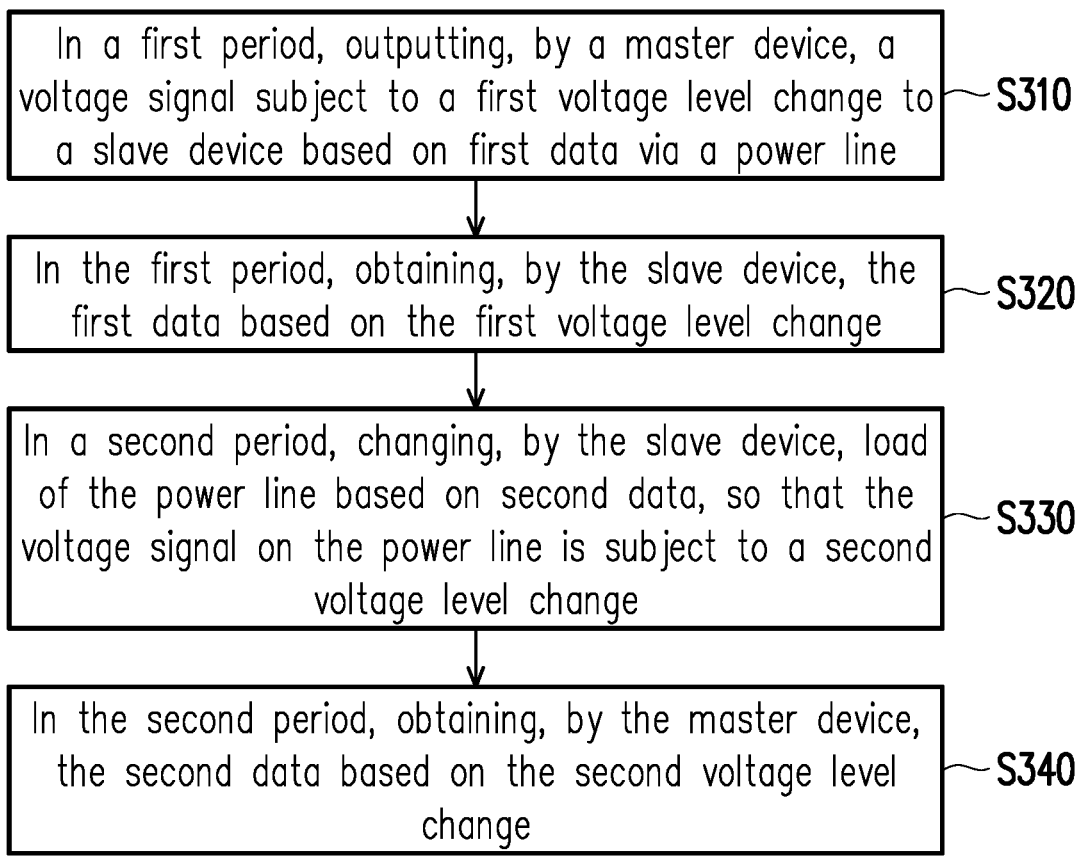
FIG. 3 is a flowchart of a data transmission method according to an embodiment of the invention.

FIG. 3 is a flowchart of a data transmission method according to an embodiment of the invention. Referring to FIG. 1 and FIG. 3, the data transmission method in the present embodiment may be applied to the master-slave system 100 in FIG. 1, to enable the master-slave system 100 to perform the following steps S310 to S340. Step S310: In a first period, the master device 110 outputs a voltage signal subject to a first voltage level change to the slave device 120 based on first data CS via the power line 130. Step S320: In the first period, the slave device 120 obtains the first data CS based on the first voltage level change. Step S330: In a second period, the slave device 120 changes load of the power line 130 based on second data, so that the voltage signal on the power line 130 is subject to a second voltage level change. Step S340: The master device 110 obtains the second data FS based on the second voltage level change. Therefore, according to the data transmission method and the master-slave system 100 in the present embodiment, a function of bidirectional communication can be effectively performed.

In addition, for device details, implementation means, and technical features of the master-slave system 100 in the present embodiment, reference may be made to the descriptions of the embodiments of FIG. 1 and FIG. 2 to obtain sufficient teaching, suggestions, and implementation instructions. Therefore, the descriptions thereof are omitted herein.

Based on the above, according to the master-slave system and the data transmission method thereof in the invention, a function of bidirectional data transmission can be implemented by imposing a specific voltage level change to a voltage signal transmitted on a power line. Further, from another perspective, according to the master-slave system and the data transmission method thereof in the invention, both a power signal and a data signal can be transmitted via a single power line, to effectively simplify wiring between a master device and a slave device.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A master-slave system, comprising:
a slave device; and
a master device, coupled to the slave device via a power line and configured to output a voltage signal to the slave device via the power line, wherein
in a first period, the master device outputs the voltage signal subject to a first voltage level change to the slave device based on first data via the power line, so that the slave device obtains the first data based on the first voltage level change, and
in a second period, the slave device changes load of the power line based on second data, so that the voltage signal on the power line is subject to a second voltage level change, and the master device obtains the second data based on the second voltage level change.

2. The master-slave system according to claim 1, wherein the master device comprises:
a controller; and
a voltage level regulator, coupled to the controller and the power line and configured to change a voltage level of the voltage signal in the first period based on the first data provided by the controller, so that the voltage signal is subject to the first voltage level change in the first period.

3. The master-slave system according to claim 2, wherein the master device comprises:
a voltage level detector, coupled to the controller and the power line and configured to detect the second voltage level change of the voltage signal in the second period to provide the second data to the controller.

4. The master-slave system according to claim 1, wherein the slave device comprises:
a slave device chip, coupled to the power line; and
a load element, coupled to the slave device chip and configured to change the load of the power line, so that the voltage signal is subject to the second voltage level change in the second period.

5. The master-slave system according to claim 1, wherein the first voltage level change and the second voltage level change fall within an operating voltage range of the slave device.

6. The master-slave system according to claim 1, wherein the first data and the second data are digital data, and the first data and the second data each comprise a first element value and a second element value, wherein
the first voltage level change and the second voltage level change each correspond to the first element value and the second element value as two voltage level change patterns.

7. The master-slave system according to claim 6, wherein the first element value is 0, and the second element value is 1.

8. The master-slave system according to claim 6, wherein the two voltage level change patterns of the first voltage level change are an allocation proportion or an arrangement manner in a unit of time of a first voltage level and a second voltage level that are different, and
wherein the two voltage level change patterns of the second voltage level change are an allocation proportion or an arrangement manner in a unit of time of a third voltage level and a fourth voltage level that are different.

9. The master-slave system according to claim 6, wherein the two voltage level change patterns of each of the first voltage level change and the second voltage level change are different voltage pulse quantities or different voltage pulse lengths in a unit of time.

10. The master-slave system according to claim 1, wherein the master device is a writer, and the slave device comprises a storage apparatus chip, and
the first data is written data written to the slave device, and the second data is feedback data in response to whether the slave device completely receives the written data.

11. A data transmission method of a master-slave system, applied to a master device and a slave device, wherein the master device is coupled to the slave device via a power line and outputs a voltage signal to the slave device via the power line, wherein the data transmission method comprises:
in a first period, outputting, by the master device, the voltage signal subject to a first voltage level change to the slave device based on first data via the power line;
in the first period, obtaining, by the slave device, the first data based on the first voltage level change;
in a second period, changing, by the slave device, load of the power line based on second data, so that the voltage signal on the power line is subject to a second voltage level change; and
in the second period, obtaining, by the master device, the second data based on the second voltage level change.

12. The data transmission method according to claim 11, wherein the step of outputting, by the master device, the voltage signal subject to the first voltage level change to the slave device based on the first data via the power line comprises:
changing, by a voltage level regulator of the master device, a voltage level of the voltage signal in the first period based on the first data, so that the voltage signal is subject to the first voltage level change in the first period.

13. The data transmission method according to claim 11, wherein the step of obtaining, by the master device, the second data based on the second voltage level change comprises:
detecting, by a voltage level detector of the master device, the second voltage level change of the voltage signal in the second period to obtain the second data.

14. The data transmission method according to claim 11, wherein the step of changing, by the slave device, the load of the power line based on the second data comprises:
  changing, by a load element of the slave device, the load of the power line, so that the voltage signal is subject to the second voltage level change in the second period.

15. The data transmission method according to claim 11, wherein the first voltage level change and the second voltage level change fall within an operating voltage range of the slave device.

16. The data transmission method according to claim 11, wherein the first data and the second data are digital data, and the first data and the second data each comprise a first element value and a second element value,
  wherein the first voltage level change and the second voltage level change each correspond to the first element value and the second element value as two voltage level change patterns.

17. The data transmission method according to claim 16, wherein the first element value is 0, and the second element value is 1.

18. The data transmission method according to claim 16, wherein the two voltage level change patterns of the first voltage level change are an allocation proportion or an arrangement manner in a unit of time of a first voltage level and a second voltage level that are different,
  wherein the two voltage level change patterns of the second voltage level change are an allocation proportion or an arrangement manner in a unit of time of a third voltage level and a fourth voltage level that are different.

19. The data transmission method according to claim 16, wherein the two voltage level change patterns of each of the first voltage level change and the second voltage level change are different voltage pulse quantities or different voltage pulse lengths in a unit of time.

20. The data transmission method according to claim 11, wherein the master device is a writer, and the slave device comprises a storage apparatus chip,
  wherein the first data is written data written to the slave device, and the second data is feedback data in response to whether the slave device completely receives the written data.

* * * * *